US007299307B1

(12) United States Patent
Early et al.

(10) Patent No.: US 7,299,307 B1
(45) Date of Patent: Nov. 20, 2007

(54) ANALOG I/O WITH DIGITAL SIGNAL PROCESSOR ARRAY

(75) Inventors: Adrian Early, Snohomish, WA (US); Harold Kutz, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 125 days.

(21) Appl. No.: 10/329,162

(22) Filed: Dec. 24, 2002

(51) Int. Cl.
*G06F 13/00* (2006.01)
*G06F 3/00* (2006.01)
*G06F 17/50* (2006.01)

(52) U.S. Cl. .......................... 710/33; 710/36; 716/16; 716/17

(58) Field of Classification Search .................. 710/5, 710/29, 33, 58, 39; 326/39; 716/16, 17
See application file for complete search history.

(56) References Cited

U.S. PATENT DOCUMENTS

| 5,276,739 | A | * | 1/1994 | Krokstad et al. | ........... 381/318 |
| 5,408,235 | A | * | 4/1995 | Doyle et al. | ................ 341/143 |
| 5,625,583 | A | * | 4/1997 | Hyatt | .......................... 365/45 |
| 5,661,433 | A | * | 8/1997 | LaRosa et al. | .............. 329/341 |
| 5,728,933 | A | * | 3/1998 | Schultz et al. | ............. 73/146.5 |
| 6,035,320 | A | * | 3/2000 | Kiriaki et al. | ............... 708/819 |
| 6,460,172 | B1 | | 10/2002 | Insenser Farre et al. | ...... 716/17 |
| 6,556,044 | B2 | * | 4/2003 | Langhammer et al. | ........ 326/40 |
| 6,636,169 | B1 | * | 10/2003 | Distinti et al. | .............. 341/126 |
| 6,750,876 | B1 | * | 6/2004 | Atsatt et al. | ................. 345/656 |
| 2003/0086300 | A1 | * | 5/2003 | Noyes et al. | ........... 365/189.01 |
| 2003/0197635 | A1 | * | 10/2003 | Mueck et al. | ................ 341/155 |

OTHER PUBLICATIONS

1.The Authoritative Dictionary of IEEE Standards Terms; 2000; IEEE Press; Seventh Edition, p. 949☐☐.*

* cited by examiner

*Primary Examiner*—Alan S. Chen

(57) ABSTRACT

Embodiments of the present invention relate to a programmable logical semiconductor device which is tailored for implementing digital signal processing functions. The programmable logical semiconductor device comprises one or more functional user modules and at least one of the functional user modules is configurable to implement digital signal processing functions. The programmable logical semiconductor device has analog connections that are capable of being coupled to at least one of the functional user modules and to route signals to the functional user module, including an analog signal processor coupled to the analog connection. The programmable logical semiconductor device also has one or more registers coupled to the functional user modules for storing coefficients to configure the functional user modules. One or more of the user modules comprises a switched capacitor filter.

19 Claims, 6 Drawing Sheets

ANALOG I/O WITH DIGITAL SIGNAL PROCESSOR ARRAY

FIELD OF THE INVENTION

Embodiments of the present invention relate to the field of configurable and programmable logical semiconductor devices.

BACKGROUND OF THE INVENTION

Application-specific integrated circuits (ASICs), have been supplanted more and more by integrated circuits (ICs) that can be programmed to fulfill multiple functions. There are now many various programmable logic architectures, including, for example, programmable logic devices ("PLDs"), programmable logic arrays ("PLAs"), complex programmable logic devices ("CPLDs"), field programmable gate arrays ("FPGAs") and programmable array logic ("PALs"). Although there are differences between these various architectures, each of the architectures typically include a set of input conductors coupled as inputs to an array of logic whose outputs, in turn, act as inputs to another portion of the logic device. Complex Programmable Logic Devices ("CPLDs") are large scale PLDs that, like many programmable architectures, are configured to the specific requirements of an application by programming.

Previously, a device was programmed once for a specific function which would be its only function for its lifetime. Each of these architectures, though, has begun to be implemented in a reprogrammable form. A programmable logic device can now be reprogrammed while in operation and can fulfill the functions of many different devices. One of the more complex reprogrammable logic devices is the programmable-system-on-chip, or PSoC™, which can be implemented as any of a number of devices, anywhere from simple logic gates to those as complex as microcontrollers.

It is noted here that this discussion of the background of the present invention uses the term "PSoC™" extensively. PSoC™ is a registered trademark of Cypress Semiconductor Corp. However, the use of the terms "PSoC" or "PSoC™", each time they are used, is meant to include all forms of complex programmable and reprogrammable logic device architectures, including PLD, PLA, CPLD, FPGA and PAL.

Programmable devices continue to expand capability to applications previously retained for ASICs. These new applications include such specialized areas as digital signal processing (DSP) and hybrid (analog and digital devices on the same chip), which can be implemented as any of a number of devices, anywhere from simple logic gates to those as complex as microcontrollers.

One of the most demanding applications for a programmable logic array, such as PSoC™, is in the area of digital signal processing, or DSP. DSP requires that both analog and digital functions be accommodated in processing hardware, extremely rapidly, on the same chip. This is limited by the structures achievable in known semiconductor manufacturing processes. Previous generations of PSoC™ have provided a number of analog and digital, reconfigurable, PSoC™ blocks. However, due to the nature of digital reconfigurable PSoC blocks, the previous architectures have not performed digital filtering and other DSP functions well, if at all.

Some previous techniques for accomplishing DSP have used the same processor for both DSP and other functions. Detrimentally, when some complex mathematical functions have had to be performed by the main microprocessor, it has been taken away from other crucial functions.

It can be difficult to accomplish real-time DSP if the main processor is too heavily multi-tasked. Often the processor is needed to perform some necessary DSP computations but is also required for critical control functions and the DSP function performance must be delayed.

The conventional modern processors involved in complex calculations tend to be very large and to be enabled to perform many extra functions. To do so they must be run fast, necessitating ungainly bit-level programming when configuring for DSP functions.

Typically, DSP requires that relatively high speed analog signals be converted to digital equivalents prior to being brought into a processor chip for filtering, decimation (sampling rate reduction), or other intended functions. This multi-step process can put extra demands on a central processor and can entail adverse speed degradation. Additionally, requiring separate semiconductor devices to accomplish different DSP functions also necessitates using up valuable device real estate and limits miniaturization of the end products.

A need exists, therefore, for a configurable, device that accommodates real-time digital signal processing. Furthermore, such a device and its configuration must be user-friendly, enabling a user of normal skills to rapidly configure enormously complex programmable devices with multiple configurations.

SUMMARY OF THE INVENTION

Disclosed herein is a method for improving and streamlining the configuration of highly complex programmable devices such as PSoC programmable logic arrays or microcontrollers to perform the functions required of each programmed device configuration. The method disclosed is user-friendly, enabling a user of normal skills to rapidly configure enormously complex programmable devices with multiple configurations.

Embodiments of the present invention relate to a programmable logical semiconductor device which is tailored for implementing digital signal processing functions. The programmable logical semiconductor device comprises one or more functional user modules and at least one of the functional user modules is configurable to implement digital signal processing functions. The programmable logical semiconductor device has analog connections that are capable of being coupled to at least one of the functional user modules and to route signals to the functional user module. The programmable logical semiconductor device also has one or more registers coupled to the functional user modules for storing coefficients to configure the functional user modules. One or more of the user modules comprises a switched capacitor filter.

Embodiments are also directed to a computer tool for implementing digital signal processing in a programmable logical semiconductor device comprising: a graphical representation of the programmable logical semiconductor device displayed on a display screen, the graphical representation comprising a plurality of processor blocks disposed in an array; a graphical representation of an input/output structure for the processor blocks in the programmable logical semiconductor device; a graphical representation of an interconnect matrix for the processor blocks; and a configuration register for storing configuration data, wherein a selection of an item in a graphical display results in the configuration data being written in the configuration register.

Embodiments are also directed to the above wherein at least one of the processor blocks comprises a switched capacitor filter and wherein the computer tool further comprises a cursor control device for implementing the selection. Embodiments are also directed to the above wherein at least one of the processor blocks comprises and Analog-to-Digital Converter (ADC) or Digital-to-Analog Converter (DAC), including an over-sampled or delta-sigma converter. Embodiments are also directed to the above wherein the programmable logical semiconductor device is a programmable system on a chip.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

Embodiments of the present invention are implemented in a graphical configuration tool. The configuration tool is incorporated herein by reference to patent application U.S. Ser. No. 09/989,570 entitled "METHOD FOR FACILITATING MICROCONTROLLER PROGRAMMING," filed Nov. 19, 2001 and assigned to the assignee of the present invention.

Embodiments of the present invention use a graphical information window in the above referenced graphical user interface presented in a graphic display. The term "graphical information," as used in this discussion, may include both icons and text. While the particular portions of the graphic display envisioned as the device selection window and the module placement window is, in this embodiment, a particular area in the overall graphic display, other embodiments could use a different area of the display.

The embodiment of the present invention discussed here enables a family of programmable logical semiconductor devices that are constructed to be particularly amenable to configuration as digital signal processing (DSP) devices. This embodiment presents an array of PSoC™ processor blocks, which are included in the functional user modules implemented in hardware blocks, that are dedicated to perform DSP functions. It is noted that embodiments of the present invention may be implemented in programmable logic arrays other than PSoC™ devices specifically.

It is noted here that this discussion of embodiments of the present invention uses the term "PSoC™" extensively. PSoC™ is a registered trademark of Cypress Semiconductor Corp. However, the use of the terms "PSoC" or "PSoC™", each time they are used, is meant to include all forms of complex programmable and reprogrammable logic device architectures, including PLD, PLA, CPLD, FPGA and PAL.

Figure 1:
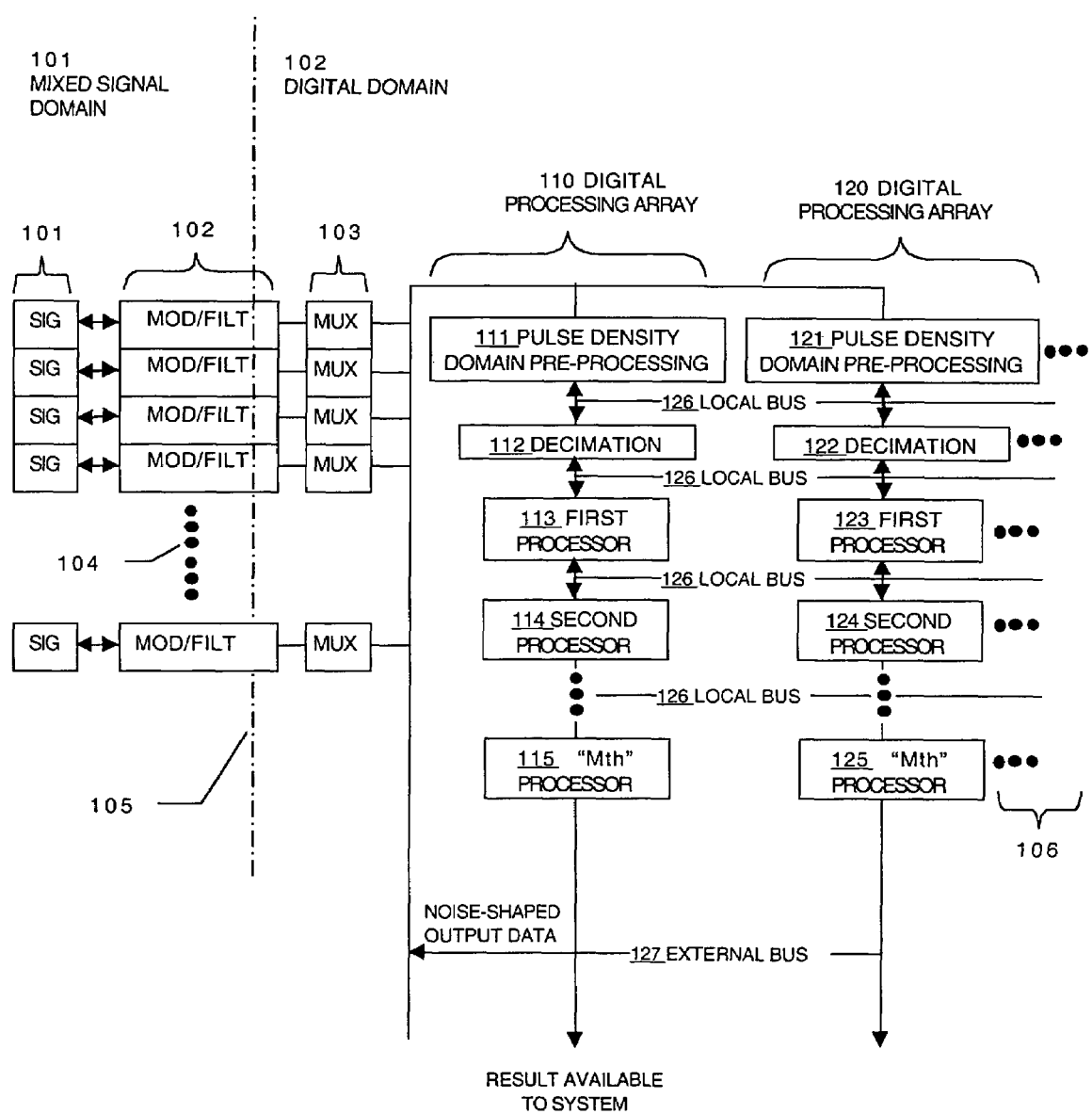
FIG. 1 illustrates a user module interconnection array in accordance with one embodiment of the present invention.

FIG. 1 illustrates a block diagram of one embodiment of the present invention. From fully capable analog device I/O connections, analog signals 101 arrive at modulator/filter array 102 where analog-to-digital conversion (ADC) takes place at 105 and the signals enter the digital domain, 152. Note that each modulator filter is also a reconstructor. Signals are then routed to the appropriate hardware, depending on the device configuration, through multiplex/demultiplex (MUX) array 103 into digital signal processing (DSP) array 110 and 120. It should be noted that, with the ability to process analog signals in much of the processing array, mixed signal domain 101 extends into the hardware processor blocks of the device in consideration in this embodiment.

In this embodiment, both DSP array 110 and 120 comprise a number of arrays of dedicated functional blocks which are configurable, in this embodiment, into the datapath-based, bit-serial, signal processors alluded to in this discussion. In DSP array 110, pulse density domain preprocessing is accomplished at 111, and data decimation at 112. The signal data then enters a series of bit serial dedicated processors, 113, 114, 115. The hardware that can be dedicated to bit-serial processors is different in different embodiments, allowing for a wide range of possible numbers of processors included in each array. This flexibility is demonstrated in FIG. 1 by the counting of "M" processors, 115, which is meant to imply that the exact number of dedicated processors is not fixed in the concepts presented in the discussion of this embodiment of the present invention.

Digital processing array 110 and array 120 have a very high degree of connectivity, meaning that the device configuration has access to a large number of configurable hardware interconnections through local bus 126, through either serial or parallel communication to other blocks. Local addressing may direct these and other connection resources. Output from the DSP arrays is routed through external bus 127, which is also configurable from extensive configurable resources, to Mux/DeMux array 103, and converted to analog signals at modulator/filter array 102. Bus 127 also avails array output data to the rest of the configured device. It should be noted that ellipses 106 are shown to imply that the number of digital processing arrays can be widely varied, depending on the hardware resources available for configuration in various embodiments.

The DSP blocks form arrays 110 and 120 in this embodiment. Other embodiments may have different numbers of arrays. As noted previously, signals are routed to the DSP blocks from the analog I/O. Pulse density preprocessors, 111 and 121, can operate on multiple data streams simultaneously. Decimators 112 and 122 filter and convert the pre-processed streams into the sampling rate and bandwidth of interest.

It should be noted here that the signal processing and inter-block communications hardware in this embodiment are constructed to be bit serial in nature. However, other embodiments of the present invention may be implemented with parallel data processing and parallel communications. DSP blocks 113 through 125 are bit serial math blocks with rich interconnectivity to neighboring blocks. Individual blocks are very localized so they require minimum size transistors, easing the demands of design and manufacture. It is noted that a transistor may need to drive over a relatively long line in the case of a bit that is coupled to a different block.

Communication between DSP blocks through local bus 126 is bit serial in this embodiment of the present invention, as noted earlier. Thus, at most two wires are needed for communication between DSP blocks. This makes programming connections between the DSP blocks relatively simple.

Embodiments of the present invention implement discrete time function filters in the digital domain, found in processors 113 through 125. Both digital signal processing and control functions, including logical decision-making, branching and control loops, may be implemented in the digital domain by these programmable DSP blocks.

Additionally, multiple blocks, in this embodiment, can be configured to cooperate in various ways to accomplish a given signal processing function. This provides better control, uses less power, and provides for selectable accuracy, or resolution, by adding additional bits to data words. For example, if the basic word length is 16-bits, to get a higher resolution, multiple 16-bit words are concatenated such as in an IRR filter, in which a number of coefficients need to be specified, higher resolution may be achieved by concatenating bits.

Re-configurable signal processing blocks in each array can be reconfigured to perform filter functions, mixer, non-linear correction of control functions, various math functions, etc. As with previous generation blocks, the DSP blocks may be configured by setting values in registers using the computer aided configuration tool.

Various embodiments of the present invention enable the performance of a large proportion of signal processing in the digital domain and less in the analog domain than in some previous mixed signal, or hybrid, devices. Some blocks in the instant embodiment are dedicated to DSP. Thus, the present invention adds DSP blocks to the PSoC architecture, which had digital blocks, communication blocks, and analog blocks. The digital blocks can implement, for example, multipurpose timers/counters supporting multiple event timers, real-time clocks, PWMs and CRCs. The communications blocks support UARTs and SPI master and slave functions. Analog blocks support functions such as Switch Capacitor blocks and data converters such as ADCs and DACs. As used in this discussion, analog-to-digital conversion or digital-to-analog can be referred to collectively as analog/digital conversion, Because the present invention uses dedicated processing, there is little control overhead and there is no problem of interrupting the main micro-processor with demands for DSP processing time. For example, filtering, modulation, and other processing functions are provided by PSoC blocks with minimal, if any, supervision by the main system or host processor. The overhead normally put into one digital signal processor (e.g., to pipeline) is unnecessary for a processor with only one relatively small task. The array of multiple processors in this embodiment, in totality and operating in parallel, accomplishes all signal processing for the various tasks required of the entire system.

A PSoC processor array can be configured by the use of a configuration tool in a computer which presents a graphic user interface (GUI). A window from an exemplary configuration tool is illustrated in FIG. 2.

Figure 2:
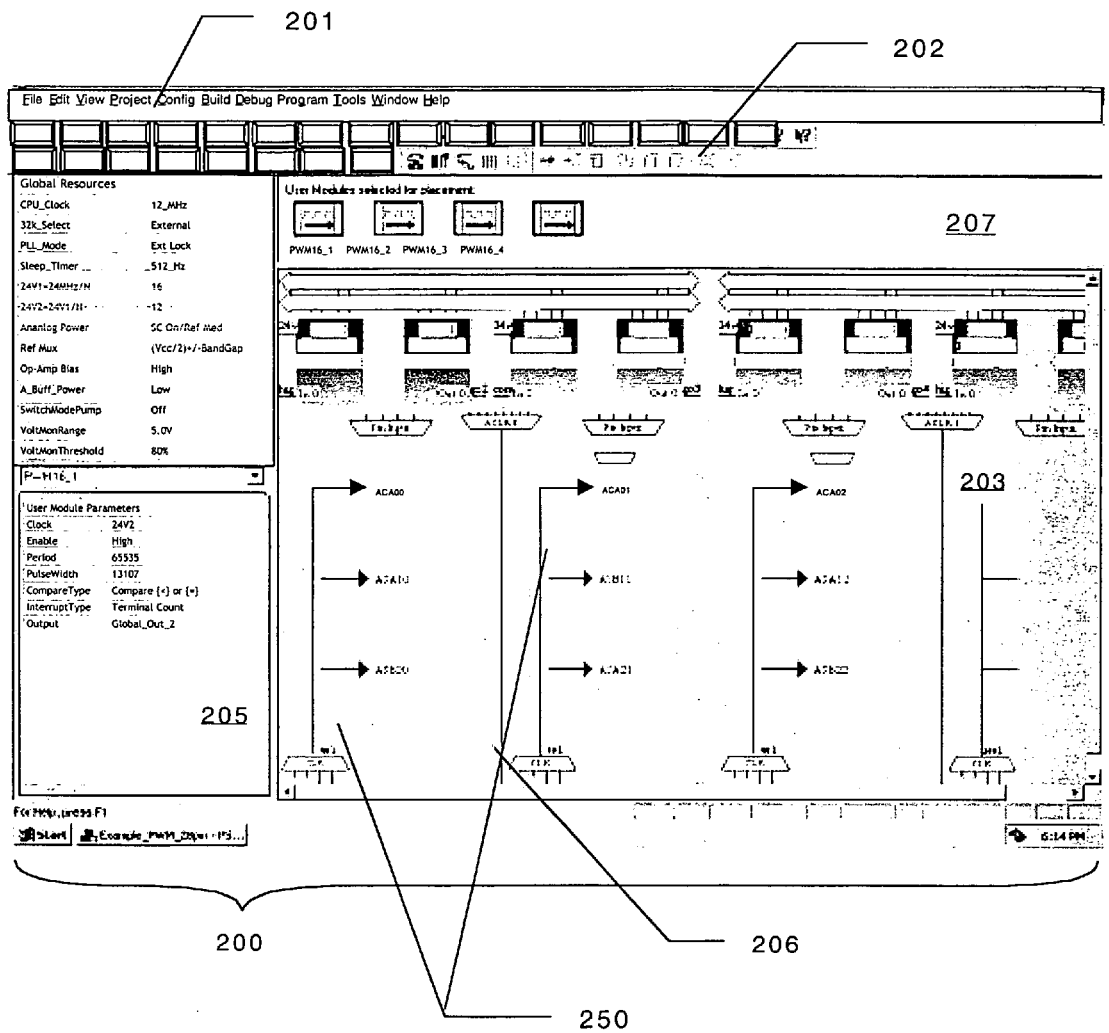
FIG. 2 illustrates an exemplary screen shot of a graphical user interface (GUI) in accordance with one embodiment of the present invention.

FIG. 2 illustrates a screenshot of the Device Placement Window in the Device Editor of the configuration tool's graphical user interface. The configuration tool of the present embodiment employs a graphical user interface to greatly ease the lengthy and tedious process of configuring complex programmable devices, including PSoC arrays (e.g. as shown in FIG. 2). When the user has selected a group of user modules suitable to the configuration desired, the Device placement Window 200 is presented to further aid in device configuration. Selected user modules are shown in iconic form in window 207. Each icon is highlighted when selected for placement in the graphical presentation of the programmable device architecture, 203, as shown in device placement window 206, by the selection of Next Placement tool button (see 504 in FIG. 5). Also shown in FIG. 2 are menu bar 201 and tool bar 202 which is illustrated in more detail in FIG. 5.

Advantageously, the block diagram of a configuration tool is connection oriented. The blocks may be programmed for specific functions. The user simply places and configures the modules, mixer, filter, etc, for example. Thus, its very easy for a user to visualize and to understand what's going on in the chip being designed. It is also a very efficient and powerful way of utilizing the Silicon.

In this embodiment of the present invention, selection of functional user modules can also include selection of digital signal processing arrays and analog modules in which the dedicated hardware is constructed to act as analog-to-digital converters (ADCs), analog amplifiers, analog filters, and digital-to-analog converters (DACs), as well as a panoply of digital processing user modules.

It should be noted here the graphical user interface is configured for a specific operating system (OS) as is indicated by some artifacts in the Figures. While such an existing operating system is quite common, this discussion in no way should be taken as to imply that use of the above operating system is integral to the concepts presented herein. Other operating systems capable of presenting a graphical user interface can be used in implementing similar embodiments. It is even conceivable that some implementation of an embodiment of the present invention could be employed on a personal data assistant or some other handheld device.

Figure 3:
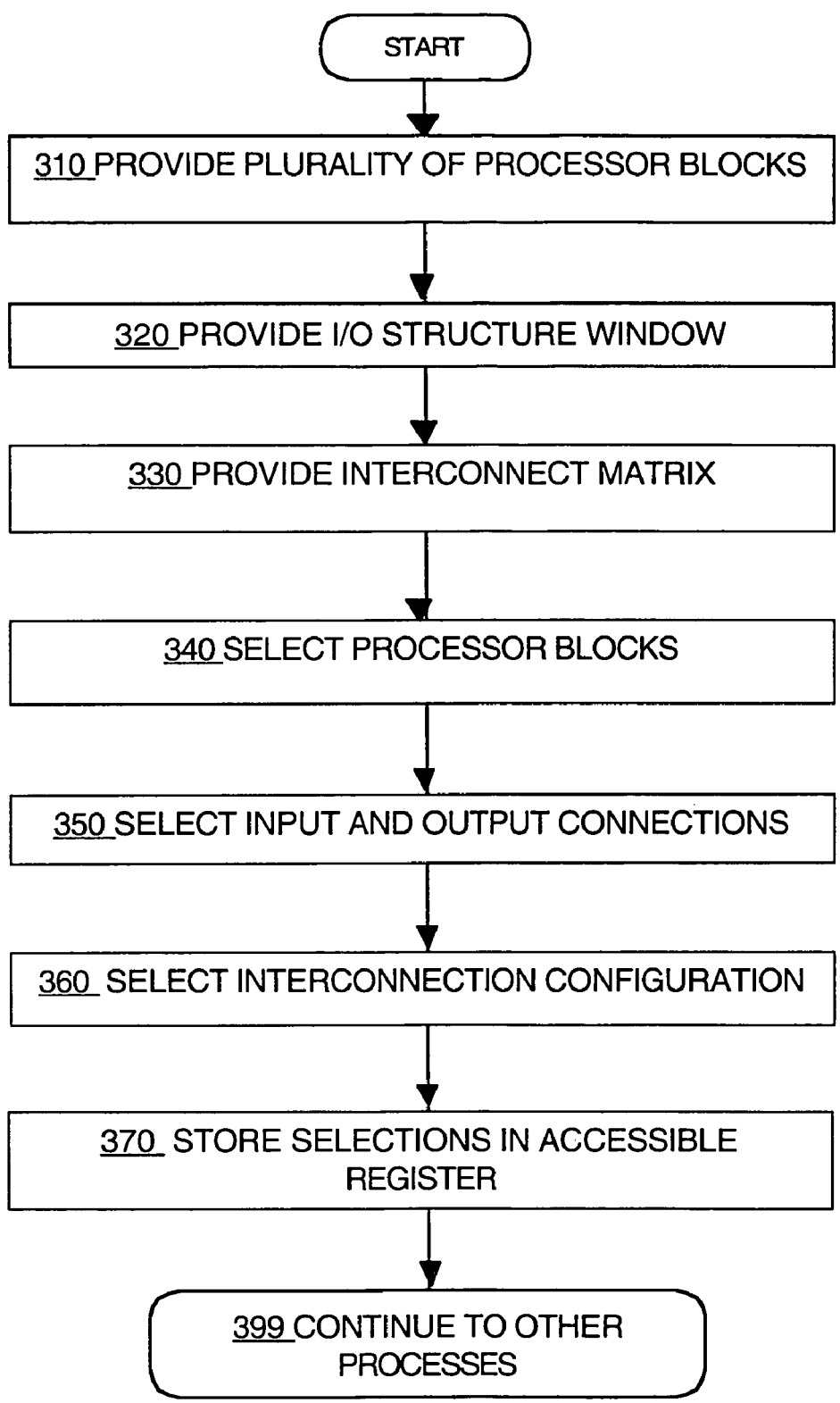
FIG. 3 illustrates a method for configuring DSP arrays in accordance with one embodiment of the present invention.

FIG. 3 illustrates a method for implementing digital signal processing functions in a PSoC device. The process begins at 310 with providing a plurality of processor blocks, also known as functional user modules, at 320 an I/O structure including analog I/O, and at 330 an interconnect matrix. Device configuration begins at 340 by selecting the desired processor blocks from the graphical presentation. Configuration continues at 350 by selecting I/O connections and at 360 by selecting the desired interconnection configuration. When desired modules and interconnections are selected, the configuration parameters are stored in a register set at 370 and the process moves on to other tasks at 399.

Figure 4:
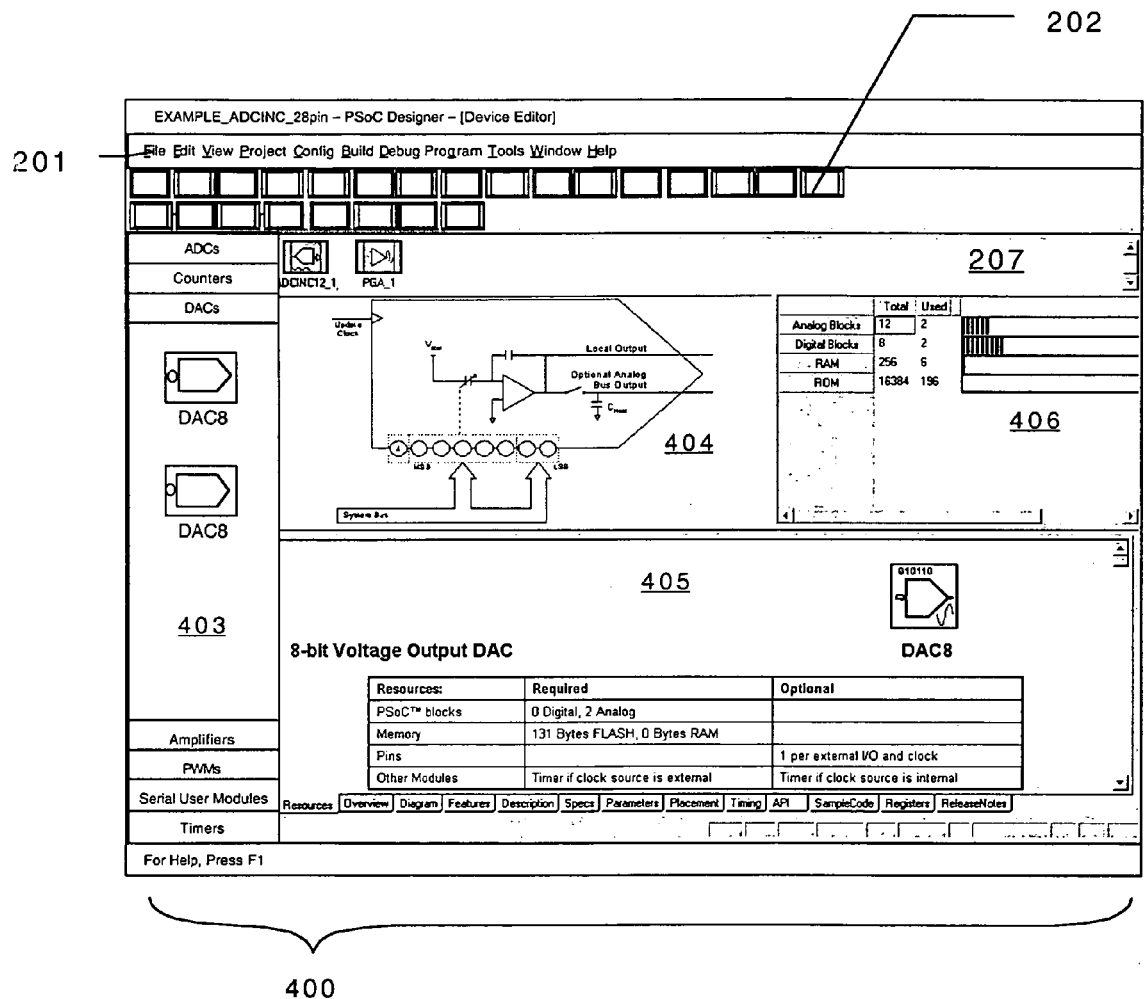
FIG. 4 illustrates a user module data sheet window from a graphical user interface (GUI) in accordance with one embodiment of the present invention.

FIG. 4 illustrates an exemplary screenshot of a selected device data display. A selected device icon causes the presentation of window 404, a functional schematic of the module, as well as devices resource window 406 and module data window 405. In the embodiment of the present invention discussed, data presented in window 405 includes data to aid in implementation of the selected modules as multi-purpose timers/counters, real-time clocks, PWMs, CRCs, communications blocks and analog blocks such as switch capacitor blocks.

Note that window 404, which shows a graphical schematic diagram of the selected user module, is used to illustrate to the user the functionality of the user module and is not to be taken as being representative of the physical implementation of the module. Each module incorporated into a configured device is actually implemented in circuitry that is reconfigurable by programming.

Note that the exemplary user module shown in FIG. 4 is a digital-to-analog converter (DAC). The inputs shown in the graphic presentation of the user module are digital bus inputs and the outputs are analog. This information, and the suitability of connections to them, is what is presented and highlighted in the Device Editor Window of FIG. 2, noted previously, when interconnections are selected.

Window 406 is also included in FIG. 4 and includes information which shows a table of available modules remaining, taking into consideration the hardware circuitry already committed to the selected user modules. The information presented in the table of interconnection characteristics also depends on the available hardware to support the user module. It is noted that the functions of the various windows illustrated here may be present in different forms in different embodiments and may not be employed in others. The rearrangement of windows in the graphical user interface does not impede nor change the functionality of this embodiment of the present invention.

When the user has selected a group of user modules suitable to the configuration desired, the Device placement Window 200 shown above in FIG. 2 is presented to further aid in device configuration. Again, selected modules are shown in iconic form in window 207. Each icon is highlighted when selected for placement in the graphical presentation of the configurable device architecture, 403, by the selection of Next Placement tool button (refer to 504 in FIG. 5). Available connections, determined by the available hardware and the functionality of the selected user modules, are highlighted to aid the user in placement. In this embodiment of the present invention, available connections and user modules are well populated with those particularly designed for analog I/O and digital signal processing.

Figure 5:
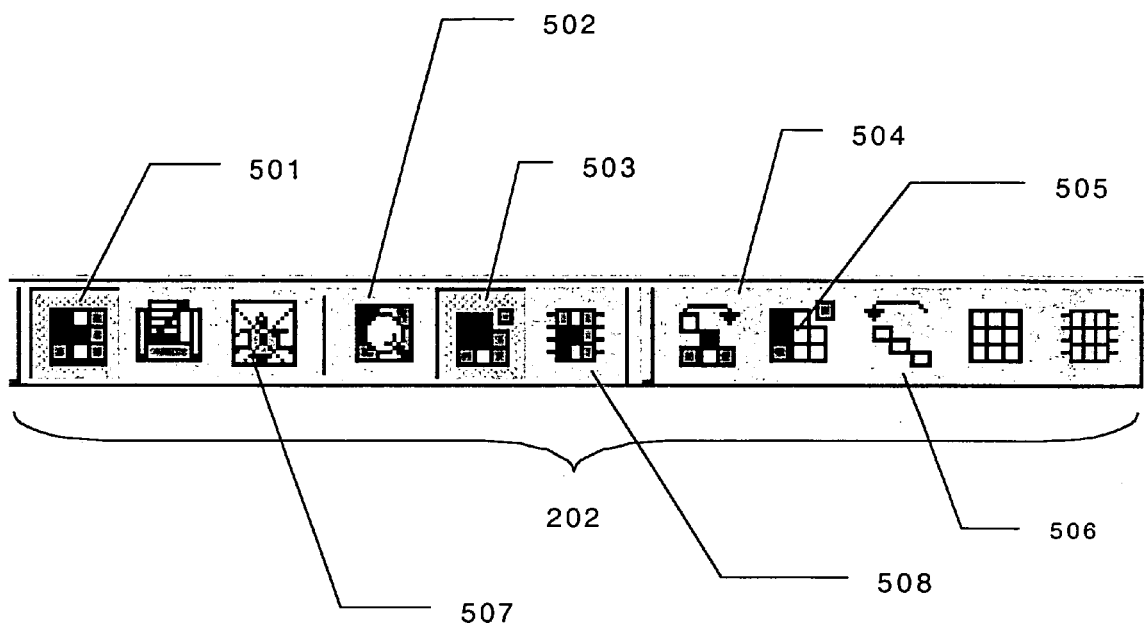
FIG. 5 illustrates a toolbar in a graphical user interface (GUI) in accordance with one embodiment of the present invention.

The embodiment of the present invention discussed here uses tool buttons in toolbar 202 to select the appropriate window for operation at hand. A portion of toolbar 202 is illustrated in FIG. 5. Toolbar 202 includes Device editor selection tool button 501, Device selection button 502, Device Placement button 503, Next (usable) Placement button 504, Place Module button 505, Undo Placement button 506, De-Bug window button 507 and Pin-Out Window button 508. Note that the arrangement of buttons and their iconic depictions are not limited to those shown. Other arrangements and icons can be used without changing the functions illustrated in this embodiment.

Once the user modules have been placed by the user and module interconnections have been made and characterized, the configuration tool in which this embodiment of the present invention is configured automatically determines the configuration registers that need to be set and automatically determines their values such that the settings can be realized. This last function needs user module placement to perform because the registers that are configured reside within the PSoC hardware blocks that are allocated to the user modules and to the interconnections. Each PSoC hardware block contains its own register set. If the user module placement is changed, then the configuration tool software recomputes the proper configuration registers and values for the new hardware. If the settings are changed, then this embodiment recomputes the proper configuration registers and values for the new settings.

When registers containing user module parameters and interconnection characteristics are configured to implement the selected settings, information based on the settings is passed to processes that automatically generate source code blocks which are also called application program interfaces (APIs). These APIs are used to talk to the user modules to implement embedded functionality of the user module. The assembly code (.asm) that is automatically generated is used by the programmer to cause the user modules to perform the desired tasks. Common functions that are required to interact with the user module, such as how to start, stop a timer and "talk" to other user modules, as in the bit serial bus 126 communication of FIG. 1, are automatically generated and represented in assembly code and header files within the software configuration tool.

Figure 6:
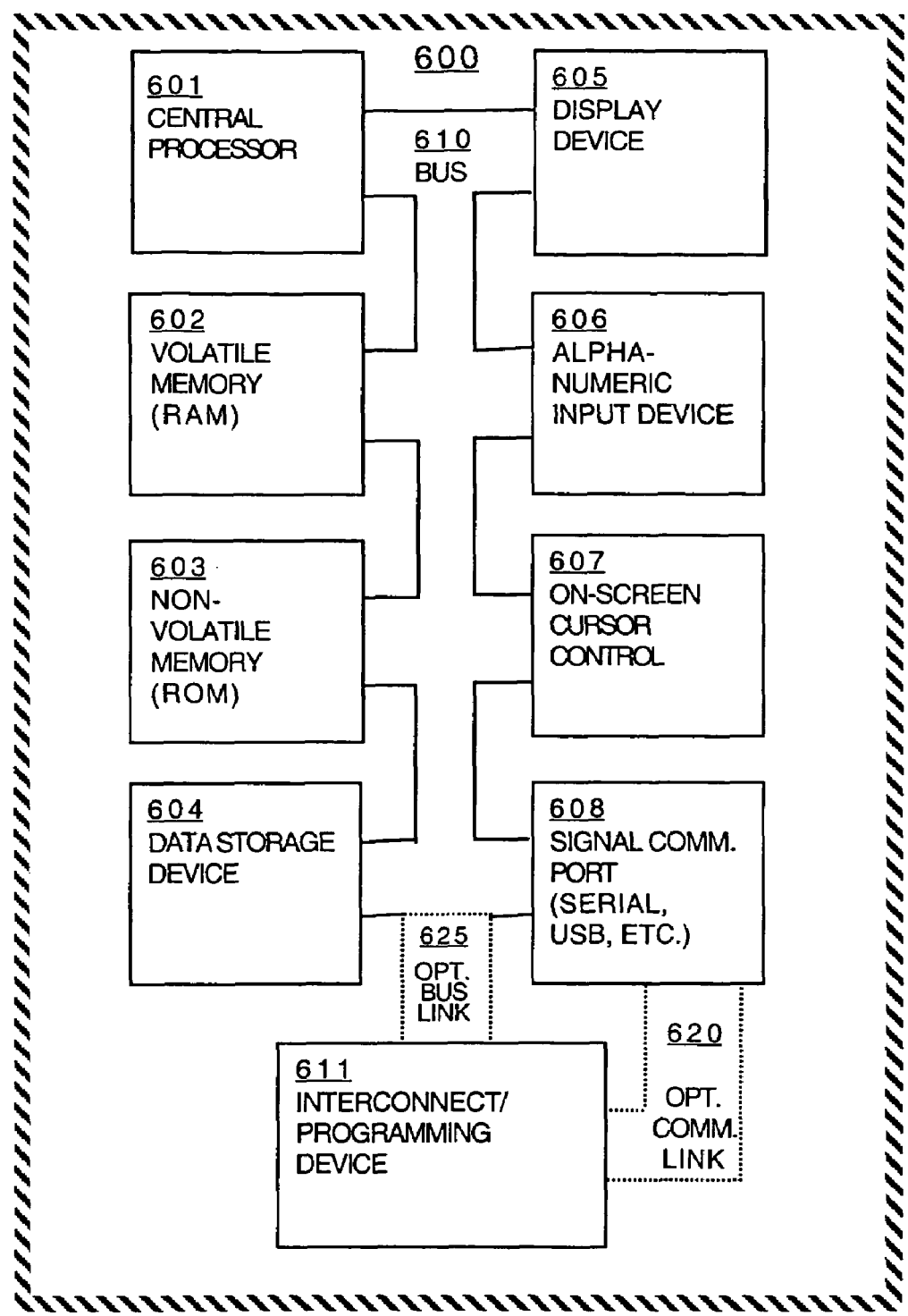
FIG. 6 illustrates a generic computer such as would be used in accordance with one embodiment of the present invention.

An embodiment of the present invention discussed here may be implemented in a computer similar to the generic computer illustrated in FIG. 6. FIG. 6 illustrates, in block diagram form, a configuration typical to a computer system. In FIG. 6, computer system 600 comprises bus 610 which electronically connects central processor 601, volatile RAM 602, non-volatile ROM 603 and data storage device 604.

Important to a concept involving a graphical user interface, as does this embodiment of the present invention, display device 605 is also connected to the bus. Similarly connected are alpha-numeric input device 606, cursor control 607, and signal I/O device 608. Signal I/O device 608 can be implemented as a serial connection, USB, an infrared transceiver or an RF transceiver. The configuration of the devices to which this embodiment of the present invention applies may vary, depending on the specific tasks undertaken. In every case with which this embodiment of the present invention is involved, however, display device 605 and cursor control 607 are implemented in one form or other. In many implementations of this embodiment, it is highly probable that interconnect/programming device 611 is also connected to computer bus 610, whether directly by bus link 625 or indirectly by signal communication 608 and communication link 620. The purpose of device 611 in this embodiment is to actually implement in device hardware the configurations developed using embodiments of the present invention. Interconnect/programming device 611 can also be implemented as a part of the circuitry suite permanently connected to the electronic environment of the targeted PSoC device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A programmable logical semiconductor device for implementing digital signal processing, comprising:
   one or more functional user modules, wherein at least one of said functional user modules is configurable to implement digital signal processing functions;
   an analog connection selectively coupled to at least one of said functional user modules via an analog signal processor that is configurable as a switched capacitor filter, said analog connection enabled to route signals to said at least one functional user module via said analog signal processor free of any intervening analog component wherein said at least one functional user module is configurable to implement digital signal processing functions; and
   one or more registers contained in said programmable logical semiconductor device and coupled to said functional user modules for storing coefficients to configure said functional user modules.

2. The programmable logical semiconductor device of claim 1, wherein said, programmable logical semiconductor device is a programmable-system-on-a-chip.

3. The programmable logical semiconductor device of claim 1, wherein said analog processor is configurable as an analog-to digital converter.

4. The programmable logical semiconductor device of claim 1, wherein said programmable logical semiconductor device is specifically tailored to perform digital signal processing functions.

5. The programmable logical semiconductor device of claim 4, wherein said functional user modules communicate by bit serial connections.

6. The programmable logical semiconductor device of claim 1, further comprising an array of functional user modules specifically tailored to enable digital signal processing functions.

7. A programmable integrated circuit device for implementing digital signal processing, comprising:
   a plurality of processor blocks disposed in an array, at least one of said processor blocks dedicated to implementing digital signal processing functions;
   an analog input/output structure coupled to said array, said analog input/output structure configured for selectively routing signals via an analog signal processor that is configurable as a switched capacitor filter free of any intervening analog component to said processor blocks in said array, wherein at least one of said processor blocks is dedicated to implementing digital signal processing functions;
   a plurality of registers contained in said programmable integrated circuit device and coupled to said processor blocks, wherein said registers store configuration values set by a configuration program where the configuration values configure said processor blocks and said input/output structure.

8. The device of claim 7 further comprising a plurality of pulse density processors coupled to said input/output structure to transmit said signals to said processor blocks of said array in a bit serial format.

9. The device of claim 8 wherein said pulse density processors are configured to operate on a plurality of signals simultaneously and provide said signals to said processor blocks of said array in parallel.

10. The device of claim 8 further comprising a plurality of decimators coupled to said input/output structure to enable bandwidth and data rate conversion of said signals when providing said signals to said processor blocks of said array.

11. The device of claim 7 wherein at least one of said analog signal processors is configurable for implementing a digital filter signal processing function.

12. The device of claim 7 wherein at least one of said analog signal processors is configurable for implementing analog/digital conversion.

13. The device of claim 7 wherein said array of processor blocks includes a configurable interconnect matrix for interconnecting neighboring processor blocks.

14. A method for performing digital signal processing in a programmable logical semiconductor device, comprising:
   providing a plurality of processor blocks disposed in an array, at least one of said processor blocks dedicated to implementing digital signal processing functions;
   providing an analog signal processing and analog input/output structure coupled to said array, said input/output structure configured for routing signals to said processor blocks in said array via an analog signal processor that is configurable as a switched capacitor filter free of any intervening analog component, wherein at least one of said processor blocks is dedicated to implementing digital signal processing functions;
   providing an interconnect matrix between said processor blocks;
   selecting one or more of said processor blocks to perform a digital processing function;
   selecting one or more input and output connections in said input/output structure;
   selecting an interconnection configuration in said interconnect matrix; and storing selections in an accessible register in said programmable logical semiconductor device.

15. The method as described in claim 14, wherein at least one of said processor blocks is specifically designed to enable digital signal processing functions.

16. The method as described in claim 14, wherein at least one of said analog signal processors is configurable as a switched capacitor filter.

17. The method as described in claim 14, wherein at least one of said analog signal processors in configurable for analog/digital conversion.

18. The method as described in claim 14 wherein said processor blocks communicate by bit serial connections.

19. The method as described in claim 14 wherein said selected processor blocks comprise an array of said user modules and wherein said array of said functional user modules is for performing digital signal processing.

* * * * *